(12) United States Patent
Jang et al.

(10) Patent No.: US 9,391,009 B2
(45) Date of Patent: Jul. 12, 2016

(54) SEMICONDUCTOR PACKAGES INCLUDING HEAT EXHAUST PART

(71) Applicants: Eon Soo Jang, Suwon-si (KR); Kyol Park, Daejeon (KR); Jongwoo Park, Seongnam-si (KR); Jin-Kwon Bae, Hwaseong-si (KR); Yunhyeok Im, Hwaseong-si (KR); Jichul Kim, Yongin-si (KR); Soojae Park, Seongnam-si (KR)

(72) Inventors: Eon Soo Jang, Suwon-si (KR); Kyol Park, Daejeon (KR); Jongwoo Park, Seongnam-si (KR); Jin-Kwon Bae, Hwaseong-si (KR); Yunhyeok Im, Hwaseong-si (KR); Jichul Kim, Yongin-si (KR); Soojae Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/289,900

(22) Filed: May 29, 2014

(65) Prior Publication Data

US 2015/0054148 A1    Feb. 26, 2015

(30) Foreign Application Priority Data

Aug. 21, 2013   (KR) ........................ 10-2013-0099173

(51) Int. Cl.
*H01L 23/36*   (2006.01)
*H01L 23/498*   (2006.01)
(Continued)

(52) U.S. Cl.
CPC .......... *H01L 23/49816* (2013.01); *H01L 23/36* (2013.01); *H01L 25/0652* (2013.01); *H01L 25/105* (2013.01); *H01L 25/50* (2013.01); *H01L 23/4334* (2013.01); *H01L 24/73* (2013.01); *H01L 2224/16145* (2013.01); *H01L 2224/16225* (2013.01); *H01L 2224/32145* (2013.01); *H01L 2224/32225* (2013.01); *H01L 2224/32245* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/06517* (2013.01); *H01L 2225/06562* (2013.01); *H01L 2225/06568* (2013.01); *H01L 2225/06572* (2013.01); *H01L 2225/06589* (2013.01); *H01L 2225/1023* (2013.01); *H01L 2225/1058* (2013.01); *H01L 2225/1094* (2013.01);
(Continued)

(58) Field of Classification Search
CPC ... H01L 23/36; H01L 23/367; H01L 23/3675; H01L 25/0652; H01L 25/0655; H01L 25/0657; H01L 25/071; H01L 25/072; H01L 25/074
See application file for complete search history.

(56) References Cited

U.S. PATENT DOCUMENTS

| 5,222,014 A | 6/1993 | Lin |
| 6,265,772 B1 | 7/2001 | Yoshida |

(Continued)

FOREIGN PATENT DOCUMENTS

| JP | 2000232186 A | 8/2000 |
| KR | 100209761 B1 | 7/1999 |

(Continued)

*Primary Examiner* — Bryan Junge
(74) *Attorney, Agent, or Firm* — Harness, Dickey & Pierce, P.L.C.

(57) ABSTRACT

According to example embodiments, a semiconductor package includes a lower package, upper packages on the lower package and laterally spaced apart from each other, a lower heat exhaust part between the lower package and the upper packages, an intermediate heat exhaust part between the upper packages and connected to the lower heat exhaust part, and an upper heat exhaust part on the upper packages and connected to the intermediate heat exhaust part.

19 Claims, 16 Drawing Sheets

(51) Int. Cl.
 H01L 25/065 (2006.01)
 H01L 25/10 (2006.01)
 H01L 25/00 (2006.01)
 H01L 23/433 (2006.01)
 H01L 23/00 (2006.01)

(52) U.S. Cl.
 CPC ........... *H01L 2924/15311* (2013.01); *H01L 2924/15331* (2013.01); *H01L 2924/181* (2013.01); *H01L 2924/18161* (2013.01)

(56) References Cited

U.S. PATENT DOCUMENTS

| | | | |
|---|---|---|---|
| 6,756,684 B2 | 6/2004 | Huang | |
| 7,473,993 B2 | 1/2009 | Baek et al. | |
| 7,675,151 B1* | 3/2010 | Boone | 257/686 |
| 8,462,511 B2 | 6/2013 | Lee | |
| 8,941,233 B1* | 1/2015 | Ngai et al. | 257/712 |
| 2003/0146519 A1 | 8/2003 | Huang | |
| 2004/0227223 A1* | 11/2004 | Sawamoto | 257/686 |
| 2005/0199992 A1 | 9/2005 | Baek et al. | |
| 2007/0246813 A1 | 10/2007 | Ong et al. | |
| 2010/0019377 A1* | 1/2010 | Arvelo et al. | 257/712 |
| 2011/0176280 A1 | 7/2011 | Lee | |
| 2011/0304035 A1 | 12/2011 | Kim et al. | |
| 2012/0043668 A1* | 2/2012 | Refai-Ahmed | H01L 23/04 257/777 |
| 2013/0099388 A1* | 4/2013 | Kim | H01L 23/36 257/774 |
| 2014/0015110 A1* | 1/2014 | Lee | H01L 25/071 257/620 |

FOREIGN PATENT DOCUMENTS

| | | |
|---|---|---|
| KR | 100233865 B1 | 12/1999 |
| KR | 20050031599 A | 4/2005 |
| KR | 20060035070 A | 4/2006 |
| KR | 20070076084 A | 7/2007 |

* cited by examiner

SEMICONDUCTOR PACKAGES INCLUDING HEAT EXHAUST PART

CROSS-REFERENCE TO RELATED APPLICATION

This U.S. non-provisional patent application claims priority under 35 U.S.C. §119 to Korean Patent Application No. 10-2013-0099173, filed on Aug. 21, 2013, in the Korean Intellectual Property Office, the disclosure of which is hereby incorporated by reference in its entirety.

BACKGROUND

Example embodiments of inventive concepts relate to semiconductor packages and, more particularly, to semiconductor packages having a package-on-package (PoP) structure.

Light, small, high speed and/or high performance electronic appliances may be developed in the electronic industry. Integrated circuit chips may be encapsulated using a packaging technique in order to be used in electronic appliances. Various research has been conducted for improving the reliability of semiconductor packages that include integrated circuit chips. For example, thermal characteristics of semiconductor packages may become more and more important as power consumption of electronic appliances increases. Power consumption of electronic appliances may increase from high operation speeds and/or large capacities.

SUMMARY

Example embodiments of inventive concepts relate to reliable semiconductor packages capable of improving heat exhaust of a semiconductor chip.

Example embodiments of inventive concepts also relate to small-sized semiconductor packages capable of reducing their heights.

According to example embodiments, a semiconductor package may include: a lower package; upper packages on the lower package, the upper packages laterally spaced apart from each other; a lower heat exhaust part between the lower package and the upper packages; an intermediate heat exhaust part between the upper packages, the intermediate heat exhaust part connected to the lower heat exhaust part; and an upper heat exhaust part on the upper packages, the upper heat exhaust part connected to the intermediate heat exhaust part.

In example embodiments, at least one of the lower, intermediate, and upper heat exhaust parts may include a heat slug.

In example embodiments, each of the upper packages may include: an upper substrate; a first upper semiconductor chip on the upper substrate; a second upper semiconductor chip on the first upper semiconductor chip; and an upper mold layer covering the second and first upper semiconductor chips.

In example embodiments, the upper packages may include: a first upper package and a second upper package, and the first and second upper packages may have a same shape and a same size.

In example embodiments, the intermediate heat exhaust part may include: a first intermediate heat exhaust part and a second intermediate heat exhaust part that are arranged in a longitudinal direction of a space between the first and second upper packages. The first intermediate heat exhaust part may be in contact with the first and second upper packages. The second intermediate heat exhaust part may be in contact with the first and second upper packages. A size and shape of the first intermediate heat exhaust part may be the same as a size and shape of the second intermediate heat exhaust part.

In example embodiments, the lower package may include: a lower substrate and a lower semiconductor chip, and each of the upper packages may include an upper substrate and an upper semiconductor chip. The upper substrates of the upper packages may be connected to each other. The upper substrates may be on an edge region of a top surface of the lower substrate, and the lower semiconductor chip may be on a center region of the top surface of the lower substrate.

In example embodiments, bottom surfaces of the upper substrates may be at a lower level than a bottom surface of the lower heat exhaust part, and the lower heat exhaust part may be surrounded by the upper substrates when viewed from a plan view.

In example embodiments, the lower heat exhaust part may include a thermal interface material (TIM).

In example embodiments, the intermediate heat exhaust part may fill a gap region between the upper packages, and the intermediate heat exhaust part may include a thermal interface material (TIM).

In example embodiments, the intermediate heat exhaust part may include a first heat slug on a sidewall of one of the upper packages, a second heat slug on a sidewall of an other of the upper packages, and a third heat slug covering the lower heat exhaust part. The third heat slug may be connected to a bottom end of the first heat slug and a bottom end of the second heat slug. The first heat slug may be spaced apart from the second heat slug.

In example embodiments, the lower package may further include a lower mold layer on a top surface of the lower substrate, and a top surface of the lower mold layer may be on the edge region may be at a lower level than a top surface of the lower semiconductor chip.

In example embodiments, the lower heat exhaust part may be in contact with bottom surfaces of the upper packages.

According to example embodiments of inventive concepts, a semiconductor package may include: a lower package; upper packages on the lower packages; a lower heat exhaust part; an intermediate heat exhaust part; and an upper heat exhaust part. The lower package may include a lower substrate, a lower semiconductor chip on the lower substrate, and a lower mold layer surrounding a sidewall of the lower semiconductor chip. The lower heat exhaust part may be between the lower semiconductor chip and the upper packages. The lower heat exhaust part may contact a top surface of the lower semiconductor chip. The intermediate heat exhaust part may be between the upper packages. The intermediate heat exhaust part may be connected to the lower heat exhaust part. The upper heat exhaust part may be on the upper packages. The upper heat exhaust part may be connected to the intermediate heat exhaust part.

In example embodiments, at least one of the lower, intermediate, and upper heat exhaust parts may include a heat slug.

According to example embodiments, a lower semiconductor package may include: a lower substrate; a lower semiconductor chip on the lower substrate; a heat exhaust structure on the lower semiconductor chip; and upper packages on the heat exhaust structure. The heat exhaust structure may include a lower heat exhaust part connected to an upper heat exhaust part through an intermediate heat exhaust part. The upper packages may be between the lower heat exhaust part and the upper heat exhaust part. The upper packages may be separated from the each other by the intermediate heat exhaust part.

In example embodiments, at least one of the lower, intermediate, and upper heat exhaust parts may include a heat slug having a thermal conductivity that is greater than a thermal conductivity of air.

In example embodiments, at least one of the lower, intermediate, and upper heat exhaust parts may include a thermal interface material (TIM).

In example embodiments, the upper packages may each include an upper semiconductor chip, and the lower semiconductor chip may be electrically connected to the upper semiconductor chips of the upper packages, respectively.

In example embodiments, the upper packages may each include an upper substrate. A portion of each one of the upper semiconductor chips may be on a corresponding one of the upper substrates. Bottom surfaces of the upper substrates may be at a lower level than a bottom surface of the lower heat exhaust part.

In example embodiments, the upper packages may each include a plurality of upper semiconductor chips sequentially stacked on each other, and the lower semiconductor chip may be electrically connected to the upper semiconductor chips of the upper packages, respectively.

BRIEF DESCRIPTION OF THE DRAWINGS

The foregoing and other features and advantages of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
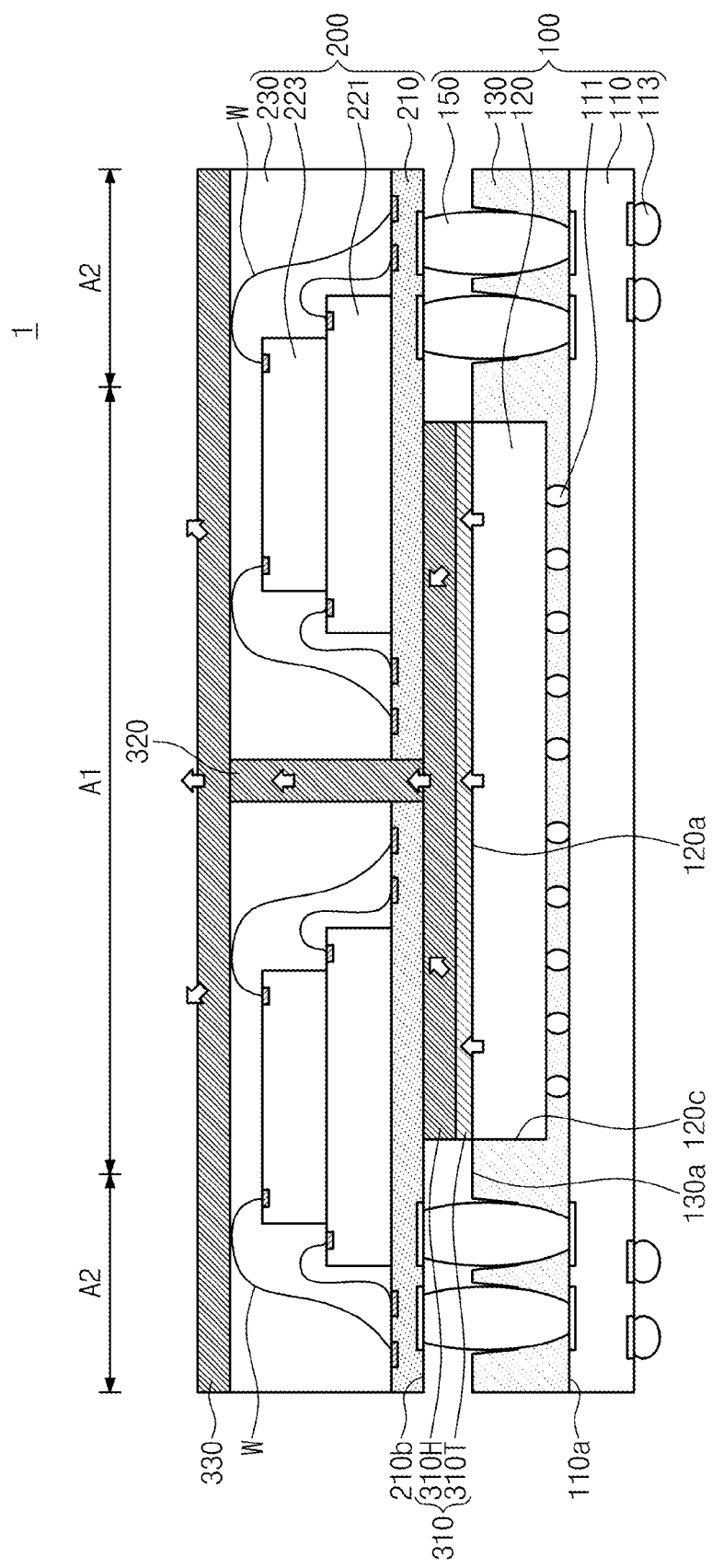
FIG. 1 is a cross-sectional view illustrating a semiconductor package according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exampled embodiments. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

The terminology used herein is for the purpose of describing particular embodiments only and is not intended to be limiting of example embodiments. As used herein, the singular forms "a," "an" and "the" are intended to include the plural forms as well, unless the context clearly indicates otherwise. Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be also understood that although the terms first, second, third etc. may be used herein to describe various elements, these elements should not be limited by these terms. These terms are only used to distinguish one element from another element, component, region, layer or section from another element, component, region, layer or section. Thus, a first element, component, region, layer or section discussed below could be termed a second element, component, region, layer or section without departing from the teachings of example embodiments. Example embodiments of aspects of inventive concepts explained and illustrated herein may include their complementary counterparts. The same reference numerals or the same reference designators denote the same elements throughout the specification.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, semiconductor packages according to example embodiments of inventive concepts will be described with reference to the drawings.

FIG. 1 is a cross-sectional view illustrating a semiconductor package according to example embodiments of inventive concepts.

Referring to FIG. 1, a semiconductor package 1 may include a lower package 100, interconnecting parts 150, upper packages 200, a lower heat exhaust part 310, an intermediate heat exhaust part 320, and an upper heat exhaust part 330. The semiconductor package 1 may include a plurality of upper packages 200 (e.g., at least two upper packages 200).

The lower package 100 may include a lower substrate 110, interconnecting terminals 111, external terminals 113, a lower semiconductor chip 120, and a lower mold layer 130. The lower semiconductor chip 120 may face down on the lower substrate 110 by a flip chip bonding technique. The lower substrate 110 may be a printed circuit board (PCB) having circuit patterns. The interconnecting terminals 111 may be disposed between the lower substrate 110 and the lower semiconductor chip 120 to electrically connect the lower semiconductor chip 110 to the lower substrate 110. The interconnecting terminals 111 may include a conductive material and may have a solder-shape or a bump-shape. The external terminals 113 may be disposed on a bottom surface of the lower substrate 110. The external terminals 113 may include a conductive material and may have a solder ball-shape. The external terminals 113 may electrically connect the lower semiconductor chip 120 and/or an upper semiconductor chip 220 to an external electronic device (not shown).

The lower semiconductor chip 120 may be mounted on a top surface 110a of the lower substrate 110. A sidewall 120c of the lower semiconductor chip 120 may be in contact with the lower mold layer 130 to be sealed with the lower mold layer 130. The lower semiconductor chip 120 may include an integrated circuit (e.g., a logic circuit).

The lower mold layer 130 may fill a space between the interconnecting parts 150 and a space between the interconnecting terminals 111 on the top surface 110a of the lower substrate 110. The lower mold layer 130 may include an insulating polymer material such as an epoxy molding compound (EMC). An uppermost top surface 130a of the lower mold layer 130 may be disposed at a substantially same level as a top surface 120a of the lower semiconductor chip 120. In this case, the lower heat exhaust part 310 may be in contact with the top surface 120a of the lower semiconductor chip 120. Alternatively, the uppermost top surface 130a of the lower mold layer 130 may be higher than the top surface 120a of the lower semiconductor chip 120. Thus, the uppermost top surface 130a of the lower mold layer 130 may cover the top surface 120a of the lower semiconductor chip 120. In this case, the lower heat exhaust part 310 may be disposed on the lower mold layer 130.

The interconnecting parts 150 may be disposed between the lower substrate 110 and upper substrates 210. Thus, the interconnecting parts 150 may electrically connect the upper packages 200 to the lower substrate 110. The interconnecting parts 150 may be arranged to surround the lower semiconductor chip 120 on the lower substrate 110 when viewed from a plan view. The interconnecting parts 150 may have a bump-shape or a solder ball-shape. The interconnecting parts 150 may include a conductive material (e.g., a metal).

The lower heat exhaust part 310 may be disposed between the lower semiconductor chip 120 and the upper substrate 210. The lower heat exhaust part 310 may include a lower heat transferring layer 310T and a heat slug 310H that are sequentially stacked on the lower semiconductor chip 120.

The heat slug 310H may include a material having a thermal conductivity greater than that of air. For example, the heat slug 310H may include a metal. In example embodiments, the heat slug 310H may include copper, but is not limited thereto. Copper may have a thermal conductivity of about 401 W/mk. If the lower heat exhaust part 310 does not exist, the top surface 120a of the semiconductor chip 120 may be in contact with air. Air may have a thermal conductivity of about 0.025 W/mk. In example embodiments, the semiconductor package 1 may include the heat slug 310H having the greater thermal conductivity than the air to more effectively exhaust heat generated from the lower semiconductor chip 120. Thus, reliability of the lower semiconductor chip 120 may be improved.

The lower heat transferring layer 310T may be disposed between the lower semiconductor chip 120 and the heat slug 310H to transfer the heat generated from the lower semiconductor chip 120 to the heat slug 310H. The lower heat transferring layer 310T may include a thermal interface material (TIM) and may have a thermal conductivity greater than that of air. For example, the lower heat transferring layer 310T may have the thermal conductivity of about 4 W/mk. The lower heat transferring layer 310T may include an adhesive material (e.g., a polymer) and/or particles (e.g., a metal) having a great thermal conductivity. The particles may be dispersed in the polymer. The lower heat transferring layer 310T may fill a space between the lower semiconductor chip 120 and the heat slug 310H. If the lower heat transferring layer 310T does not exist, air may be provided between the lower semiconductor chip 120 and the heat slug 310H. Since the lower heat exhaust part 310 may include the lower heat transferring layer 310T, the heat generated from the lower semiconductor chip 120 may be effectively transferred to the heat slug 310H through the lower heat transferring layer 310T.

Each of the upper packages 200 may include the upper substrate 210, a first upper semiconductor chip 221, a second upper semiconductor chip 223, and an upper mold layer 230.

The upper substrate 210 may be a printed circuit board (PCB) having circuit patterns. A portion of a bottom surface 210b of the upper substrate 210 may be disposed over a center region A1 of the lower substrate 110 and may be in contact with the lower heat exhaust part 310. Another portion of the bottom surface 210b of the upper substrate 210 may be disposed over an edge region A2 of the lower substrate 110 and may be in contact with the interconnecting part 150. The second upper semiconductor chip 223 may be disposed on the first upper semiconductor chip 221 and may be electrically connected to the upper substrate 210. The first upper semiconductor chip 221 and the second upper semiconductor chip 223 may be electrically connected to the upper substrate 210 through boding wires W. Alternatively, the first upper semiconductor chip 221 and/or the second upper semiconductor chip 223 may be mounted on the upper substrate 210 by a die bonding technique or a flip chip bonding technique. Each of the first and second upper semiconductor chips 221 and 223 may include an integrated circuit (e.g., a memory circuit). Each of the upper packages 200 may be molded by the upper mold layer 230. The upper mold layer 230 may cover the first and second semiconductor chips 221 and 223 on the upper substrate 210.

The intermediate heat exhaust part 320 may be disposed between the upper packages 200 and between the lower heat exhaust part 310 and the upper heat exhaust part 330. Both ends of the intermediate heat exhaust part 320 may be connected to the lower heat exhaust part 310 and the upper heat exhaust part 330, respectively. The intermediate heat exhaust part 320 may include a heat slug.

The upper heat exhaust part 330 may be provided on the upper package 200 and may be connected to the intermediate heat exhaust part 320. The upper heat exhaust part 330 may include heat slug. If the intermediate heat exhaust part 320 and/or the upper heat exhaust part 330 do not exist, the heat generated from the lower semiconductor chip 120 may be mainly transferred to the upper packages 200. In this case, the heat may influence the upper semiconductor chips 221 and 223. According to example embodiments of inventive concepts, the heat generated from the lower semiconductor chip 120 may be easily and effectively exhausted to the outside of the semiconductor package 1 through the lower heat exhaust part 310, the intermediate heat exhaust part 320 and the upper heat exhaust part 330. Thus, the reliability of the lower semiconductor chip 120 may be improved. The upper mold layer 230 may limit (and/or prevent) the heat transferred into the upper heat exhaust part 330 from influencing to the upper semiconductor chips 221 and 223.

Although FIG. 1 illustrates the upper packages 200 each include the upper semiconductor chips 221 and 223, it would be apparent to one of ordinary skill in the art that the number of upper semiconductor chips each in each of the upper packages may vary. In other words, the upper semiconductor chips 223 may be omitted or more than two upper semiconductor chips may be sequentially stacked in each of the upper packages.

Figure 2:
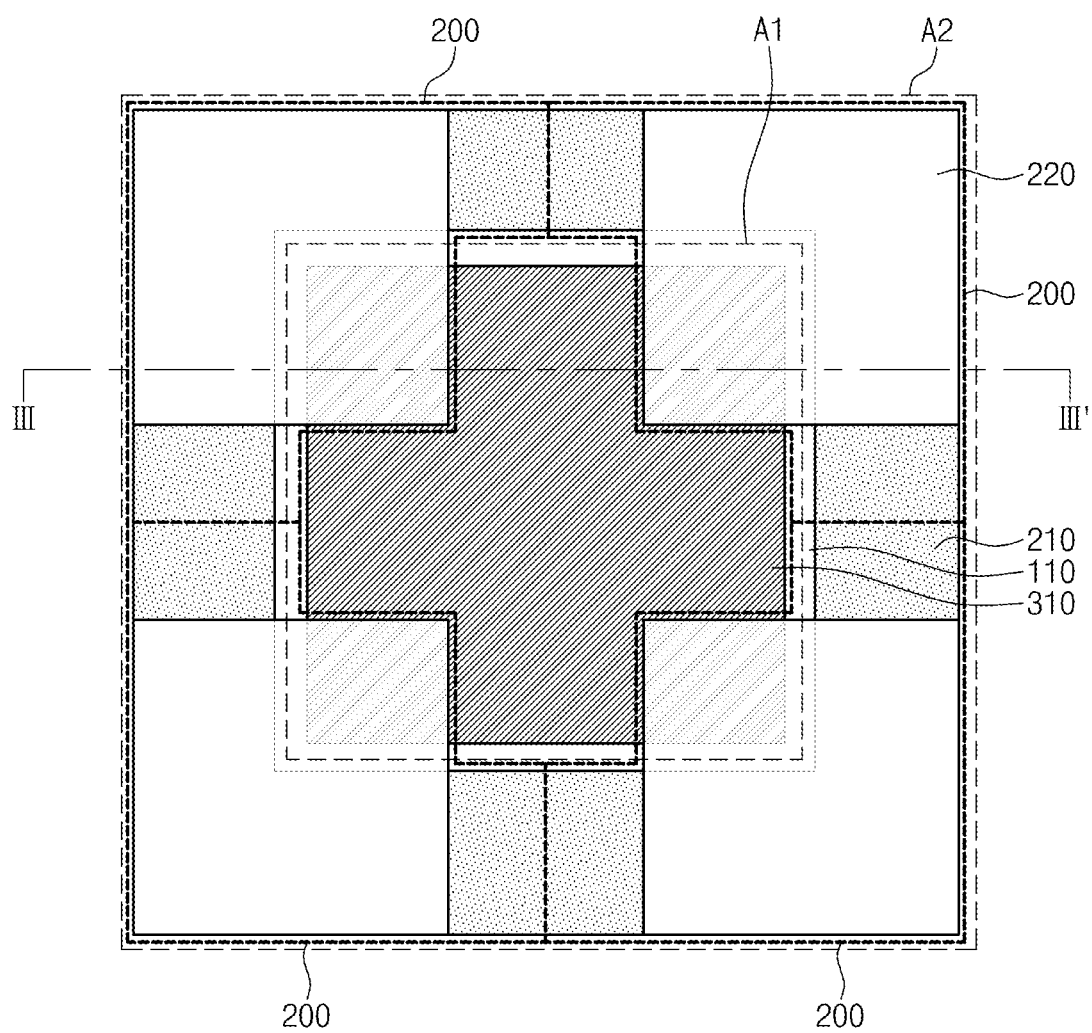
FIG. 2 is a plan view illustrating a semiconductor package according to example embodiments of inventive concepts.
Figure 3A:
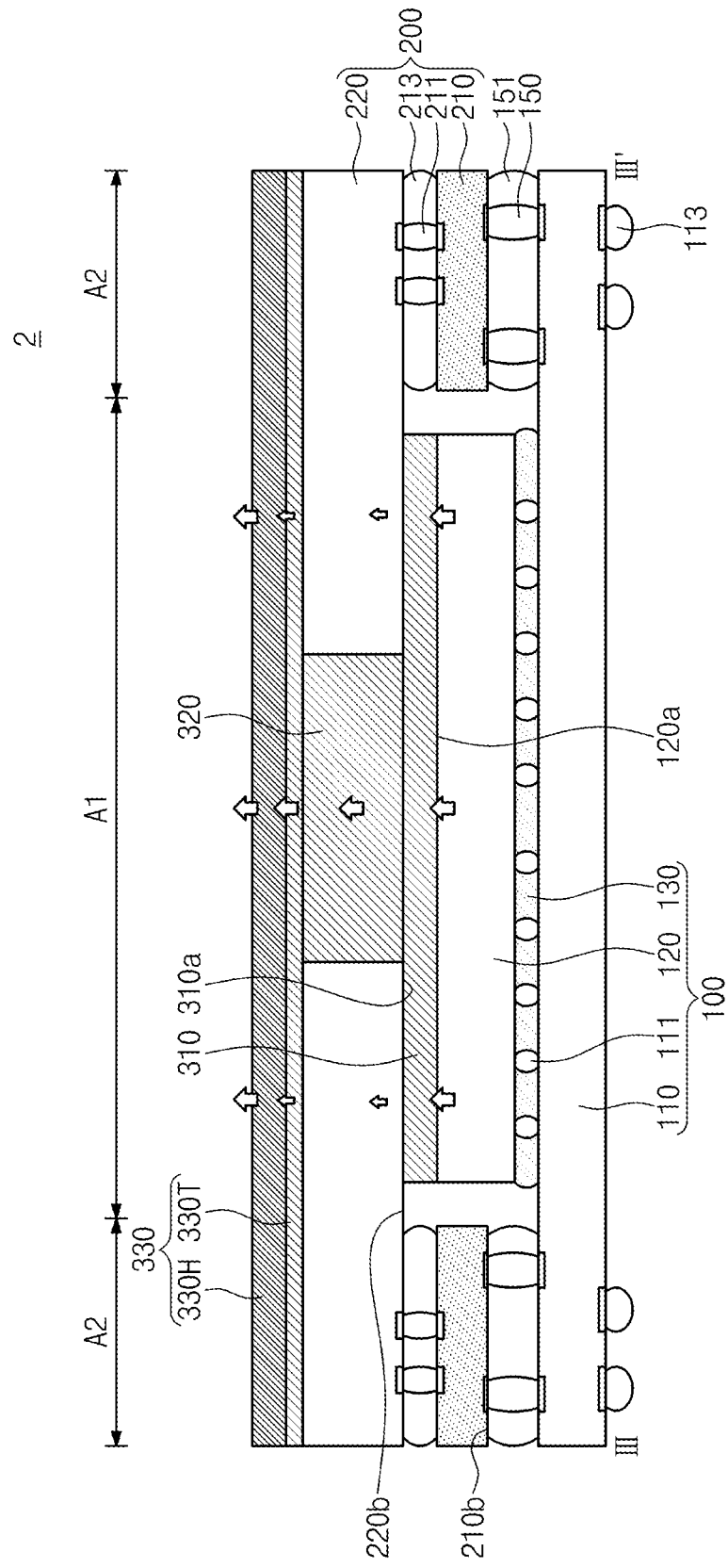
FIG. 3A is a cross-sectional view taken along a line III-III' of FIG. 2.

FIG. 2 is a plan view illustrating a semiconductor package according to example embodiments of inventive concepts. FIG. 3A is a cross-sectional view taken along a line III-III' III' of FIG. 2. Differences between FIGS. 1, 2, and 3A will mainly be described in order to avoid redundancy of explanation.

Referring to FIGS. 2 and 3A, a semiconductor package 2 may include a lower package 100, interconnecting parts 150, upper packages 200, a lower heat exhaust part 310, an intermediate heat exhaust part 320, and an upper heat exhaust part 330. The semiconductor package 2 may include a plurality of upper packages 200 (e.g., at least two upper packages 200).

The lower package 100 may include a lower substrate 110, a lower semiconductor chip 120, interconnecting terminals 111, and a lower mold layer 130. The lower substrate 110, the interconnecting terminals 111, and the lower semiconductor chip 120 may be the same as or similar to those of the semiconductor package according to example embodiments of inventive concepts previously described with reference to FIG. 1. A top surface of the lower substrate 110 may have a center region A1 and an edge region A2. The lower semiconductor chip 120 may be disposed on the center region A1 of the top surface of the lower substrate 110. The edge region A2 may surround the center region A1 when viewed from a plan view. The lower mold layer 130 may be disposed between the lower substrate 110 and the lower semiconductor chip 120. The lower mold layer 130 may fill a space between the interconnecting terminals 111 on the center region A1. The lower mold layer 130 may include an insulating polymer. The interconnecting parts 150 and an adhesive pattern 151 may be provided on the edge region A2 of the top surface of the lower substrate 110. The interconnecting parts 150 may be disposed between the lower substrate 110 and upper substrates 210 to electrically connect the upper packages 200 to the lower substrate 110. The interconnecting parts 150 may have a solder ball-shape or a bump-shape and may include a conductive material. The adhesive pattern 151 may surround and seal the interconnecting parts 150. The adhesive pattern 151 may include a thermosetting resin. The adhesive pattern 151 may be spaced apart from the lower mold layer 130.

The lower heat exhaust part 310 may be provided on the lower semiconductor chip 120. In example embodiments, the lower heat exhaust part 310 may be in contact with a top surface 120a of the lower semiconductor chip 120. The lower heat exhaust part 310 may include a thermal interface material (TIM). The lower heat exhaust part 310 may include an adhesive material (e.g., a polymer) and/or particles (e.g., a metal) having a great thermal conductivity. The particles may be dispersed in the polymer. If the lower heat exhaust part 310 does not exist, the lower semiconductor chip 120 may be in contact with air. The lower heat exhaust part 310 according to example embodiments of inventive concepts may have a thermal conductivity greater than that of the air. Thus, heat generated from the lower semiconductor chip 120 may be easily and effectively transferred to the lower heat exhaust part 310.

Each of the upper packages 200 may include the upper substrate 210 and an upper semiconductor chip 220. The upper substrate 210 may be a printed circuit board (PCB). The upper substrates 210 of the upper packages 200 may be disposed on the edge region A2 and may be connected to each other. The upper substrates 210 connected to each other may constitute one united body having a closed loop-shape. A bottom surface 210b of the connected upper substrates 210 may be disposed at a level lower than that of a top surface 310a of the lower heat exhaust part 310. The lower heat exhaust part 310 may be disposed between the upper substrates 210. The upper substrates 210 may surround the lower heat exhaust part 310 when viewed from a plan view. Since the bottom surface 210b of the upper substrates 210 is disposed at the lower level than the top surface 310a of the lower heat exhaust part 310, a thickness of the semiconductor package 2 may be reduced. Thus, a small size and a high integration degree of the semiconductor package 2 may be realized.

Each of the upper semiconductor chips 220 of the upper packages 200 may include an integrated circuit (e.g., a memory circuit). The upper semiconductor chips 220 may be laterally spaced apart from each other on the upper substrates 210 constituting the one united body. The upper semiconductor chips 220 may be electrically connected to the upper substrates 210 through upper solder balls 211 over the edge region A2 of the top surface of the lower substrate 110. An upper adhesive pattern 213 may be disposed between the upper substrate 210 and the upper semiconductor chip 220 to surround the upper solder balls 211. The upper substrates 210 may not overlap with portions of the upper semiconductor chips 220 over the center region A1. Thus, the upper substrates 210 may expose bottom surfaces 220b of the upper semiconductor chips 220 over the center region A1. Portions of the bottom surfaces 220b of the upper semiconductor chips 220 may be in contact with the lower heat exhaust part 310 over the center region A1 of the lower substrate 110. The heat generated from the lower semiconductor chip 120 may be transferred to the upper semiconductor chips 220 as well as the intermediate heat exhaust part 320 through the lower heat exhaust part 310.

The intermediate heat exhaust part 320 may be disposed between the upper semiconductor chips 220 on the lower heat exhaust part 310. The intermediate heat exhaust part 320 may include a thermal interface material (TIM) and may fill a gap region between the upper packages 200. The intermediate heat exhaust part 320 may include an adhesive material (e.g., a polymer) and/or particles (e.g., a metal) having a great thermal conductivity. The particles may be dispersed in the polymer. The intermediate heat exhaust part 320 may be connected to the lower heat exhaust part 310.

The upper heat exhaust part 330 may be disposed on the upper semiconductor chips 220 and may be connected to the intermediate heat exhaust part 320. The upper heat exhaust part 330 may include an upper heat slug 330H and an upper heat transferring layer 330T. The upper heat transferring layer 330T may be disposed between the upper heat slug 330H and the upper semiconductor chips 220 and between the intermediate heat exhaust part 320 and the upper heat slug 330H. The upper heat transferring layer 330T may include a thermal interface material (TIM). The upper heat exhaust part 330T may include an adhesive material (e.g., a polymer) and/or particles (e.g., a metal) having a great thermal conductivity. The particles may be dispersed in the polymer. In example embodiments, the upper heat exhaust part 330 may be in contact with the upper semiconductor chips 220 to exhaust heat of the upper semiconductor chips 220 to the outside of the semiconductor package 2.

In example embodiments, the heat generated from the lower semiconductor chip 120 may be exhausted to the outside of the semiconductor package 2 through the lower heat exhaust part 310, the intermediate heat exhaust part 320 and the upper heat exhaust part 300. Additionally, the heat generated from the lower semiconductor chip 120 may also be more effectively exhausted to the outside of the semiconductor package 2 through the lower heat exhaust part 310, the upper semiconductor chips 220 and the upper heat exhaust part 300.

Figure 3B:
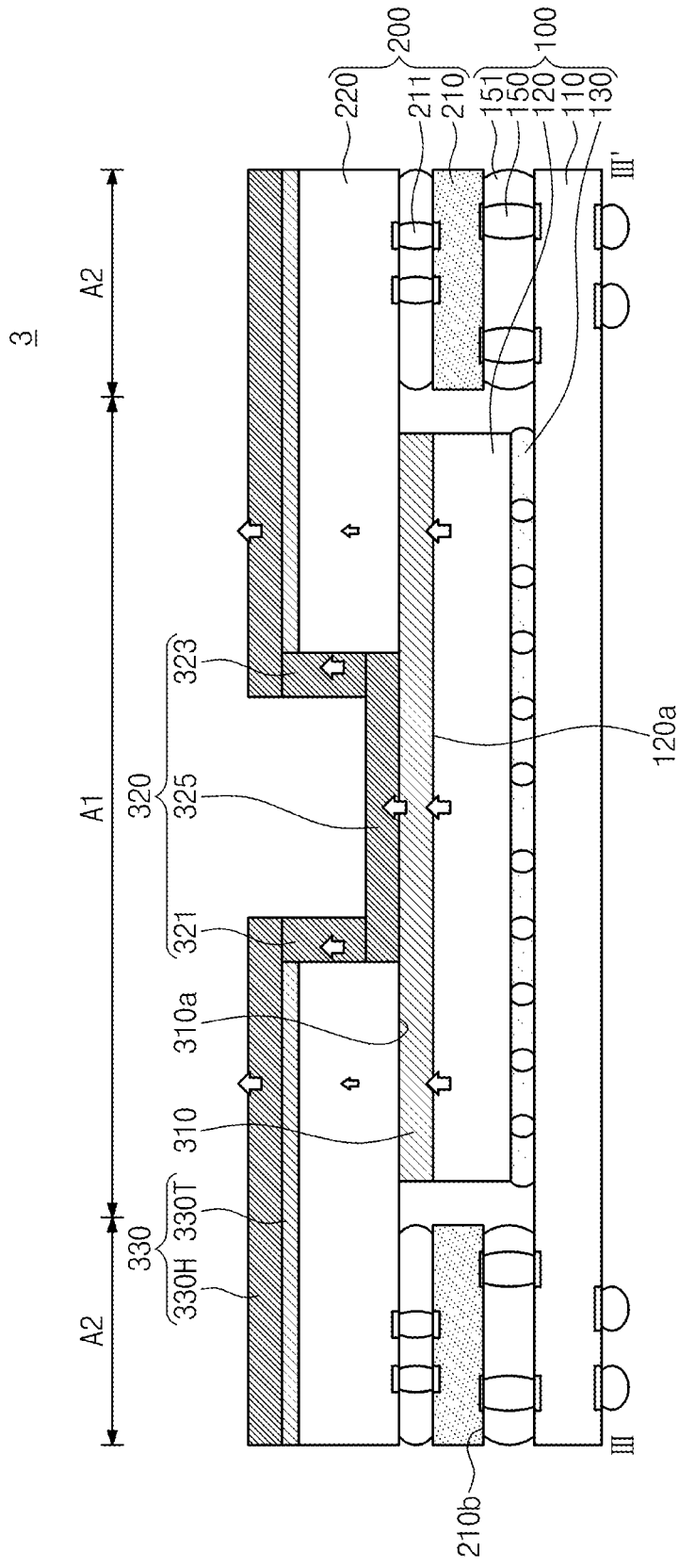
FIG. 3B is a cross-sectional view illustrating a semiconductor package according to example embodiments of inventive concepts.

FIG. 3B is a cross-sectional view illustrating a semiconductor package according to example embodiments of inventive concepts. Differences between FIGS. 1, 2, 3A, and 3B will mainly be described in order to avoid redundancy of explanation.

Referring to FIGS. 2 and 3B, according to example embodiments of inventive concepts, a semiconductor package 3 may include a lower package 100, upper packages 200, interconnecting parts 150, a lower heat exhaust part 310, an intermediate heat exhaust part 320, and an upper heat exhaust part 330. The lower package 100, the upper packages 200, the interconnecting parts 150, the lower heat exhaust part 310, and the upper heat exhaust part 330 may be the same as or similar to those of the aforementioned semiconductor packages 1 and 2. For example, the lower package 100 may include the lower substrate 110 and the lower semiconductor chip 120. Each of the upper packages 200 may include the upper substrate 210 and the upper semiconductor chip 220. The bottom surface 210b of the upper substrate 210 may be disposed at the lower level than the top surface 310a of the lower heat exhaust part 310, so that the semiconductor package 3 having a small size may be realized.

The intermediate heat exhaust part 320 may include a heat slug. The intermediate heat exhaust part 320 may be conformally formed on the top surface of the lower heat exhaust part 310 and sidewalls of the upper semiconductor chips 220. The intermediate heat exhaust part 320 may be connected to the lower heat exhaust part 310 and the upper heat exhaust part 330. For example, the intermediate heat exhaust part 320 may include a first heat slug 321, a second heat slug 323, and a third heat slug 325. The first heat slug 321 may be disposed on the sidewall of one of the upper semiconductor chips 220, and the second heat slug 323 may be disposed on the sidewall of another of the upper semiconductor chips 220. The second heat slug 323 may face the first heat slug 321. The first and second heat slug 321 and 323 may be spaced apart from each other. The third heat slug 325 may cover the lower heat exhaust part 310 and may be connected to a bottom end of the first heat slug 321 and a bottom end of the second heat slug 323. Heat transferred from the lower semiconductor chip 120 to the lower heat exhaust part 310 may be transferred to the first heat slug 321 and/or the second heat slug 323 through the third heat slug 325. The upper heat exhaust part 330 may receive the heat from the first and/or second heat slugs 321 and/or 323 and then may exhaust the heat to the outside of the semiconductor package 3. The upper heat exhaust part 330 may include an upper heat slug 330H and an upper heat transferring layer 330T. The upper heat transferring layer 330T may be disposed between the upper heat slug 330H and the upper semiconductor chips 220. The upper heat transferring layer 330T may include a thermal interface material (TIM). Sidewalls of the upper heat transferring layer 330T may be connected to sidewalls of the first heat slug 321 and the second heat slug 323, respectively. The upper heat transferring layer 330T may be connected to upper surfaces of the first heat slug 321 and the second heat slug 323, respectively.

Figure 3C:
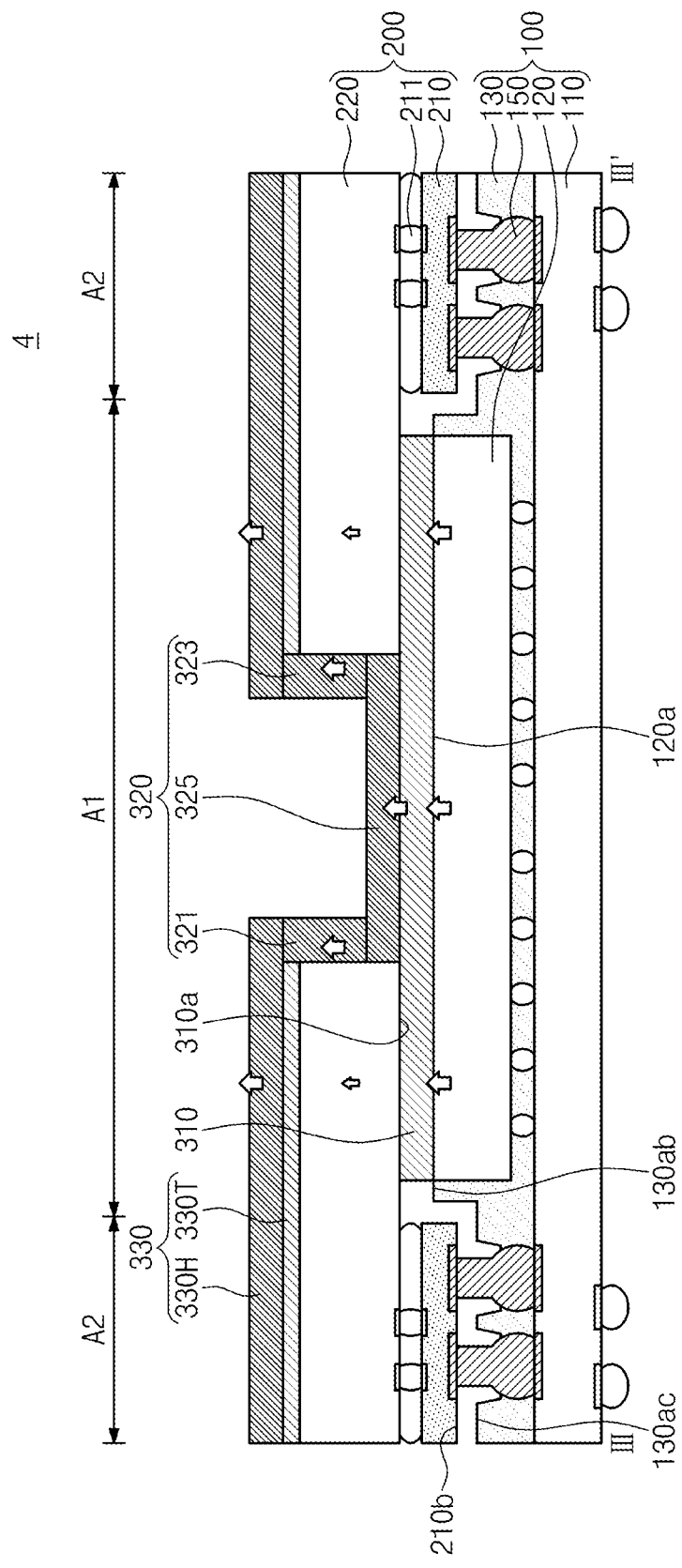
FIG. 3C is a cross-sectional view illustrating a semiconductor package according to example embodiments of inventive concepts.

FIG. 3C is a cross-sectional view illustrating a semiconductor package according to example embodiments of inventive concepts. Differences between FIGS. 1, 2, 3A, 3B, and 3C will mainly be described in order to avoid a redundant description.

Referring to FIGS. 2 and 3C, according to example embodiments of inventive concepts, a semiconductor package 4 may include a lower package 100, upper packages 200, interconnecting parts 150, a lower heat exhaust part 310, an intermediate heat exhaust part 320, and an upper heat exhaust part 330. The semiconductor package 4 may include a plurality of upper packages 200 (e.g., at least two upper packages 200). Each of the upper packages 200 may include the upper substrate 210 and the upper semiconductor chip 220.

The lower package 100 may include a lower substrate 110, a lower semiconductor chip 120, and a lower mold layer 130. The lower substrate 110 and the lower semiconductor chip 120 may be the same as or similar to those previously described. The lower mold layer 130 may be disposed between interconnecting terminals 111 and between the interconnecting parts 150 on the top surface of the lower substrate 110. The lower mold layer 130 may include an insulating polymer, for example an epoxy molding compound (EMC). A top surface 130a b of the lower mold layer 130 on the center region A1 may be disposed at a substantially same level as the top surface 120a of the lower semiconductor chip 120. Thus, the top surface 120a of the lower semiconductor chip 120 may be in contact with the lower heat exhaust part 310. A top surface 130ac of the lower mold layer 130 on the edge region A2 may be disposed at a lower level than the top surface 120a of the lower semiconductor chip 120. The bottom surface 210b of the upper substrate 210 disposed over the edge region A2 may be disposed at a lower level than the top surface 310a of the lower heat exhaust part 310. The semiconductor package 4 may have a small height. Thus the semiconductor package 4 having a small size may be realized.

The intermediate heat exhaust part 320 may be disposed between the upper packages 200. As described with reference to FIG. 3B, the intermediate heat exhaust part 320 may include the first heat slug 321, the second heat slug 323, and the third heat slug 325. Alternatively, according to example embodiments, the intermediate heat exhaust part 320 illustrated in FIG. 3A may be applied to the semiconductor package 4.

Figure 4:
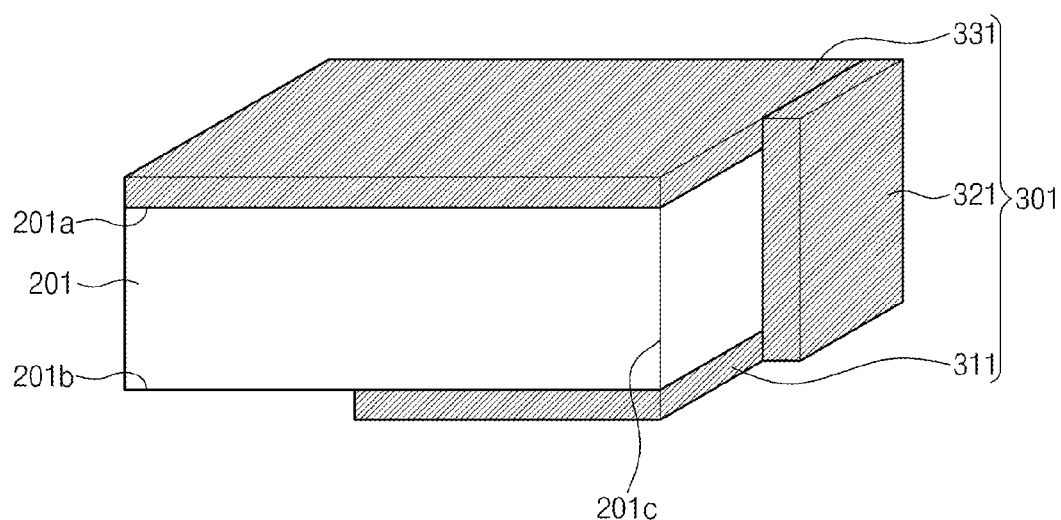
FIGS. 4 to 6 are perspective views and a cross-sectional view illustrating a method of manufacturing a semiconductor package according to example embodiments of inventive concepts.
Figure 5:
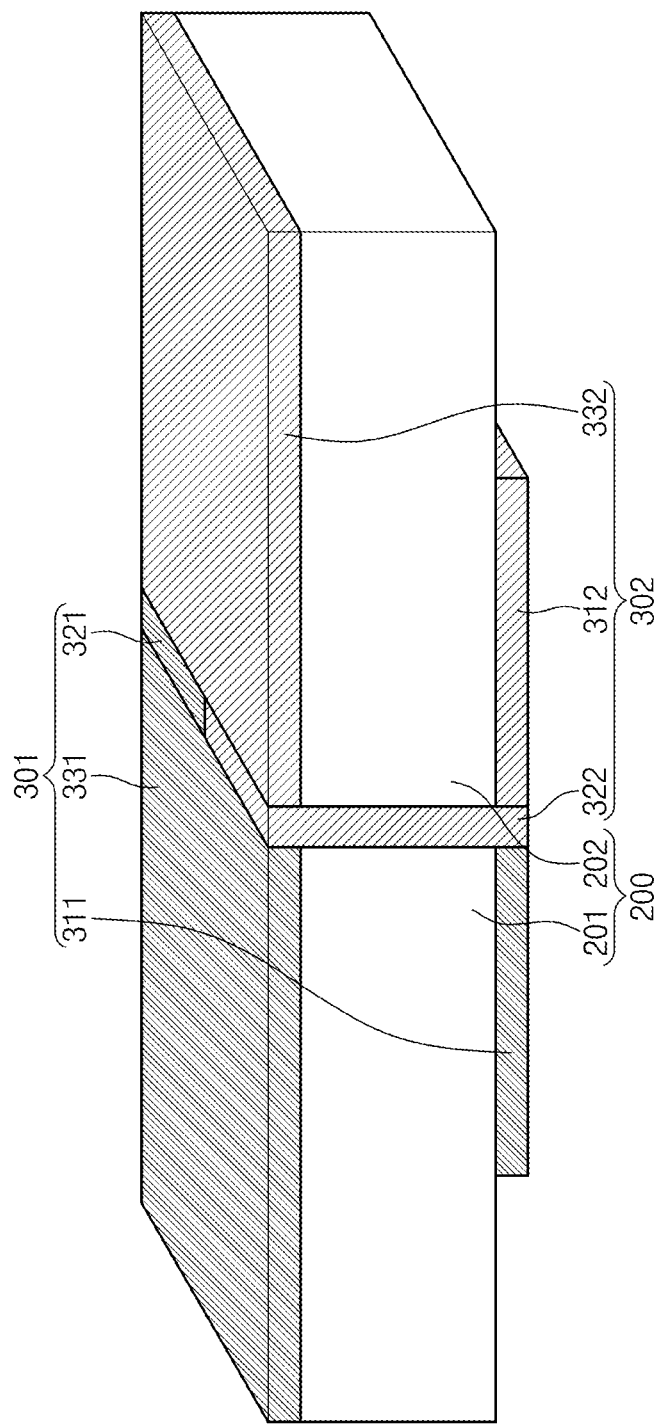
Figure 6:
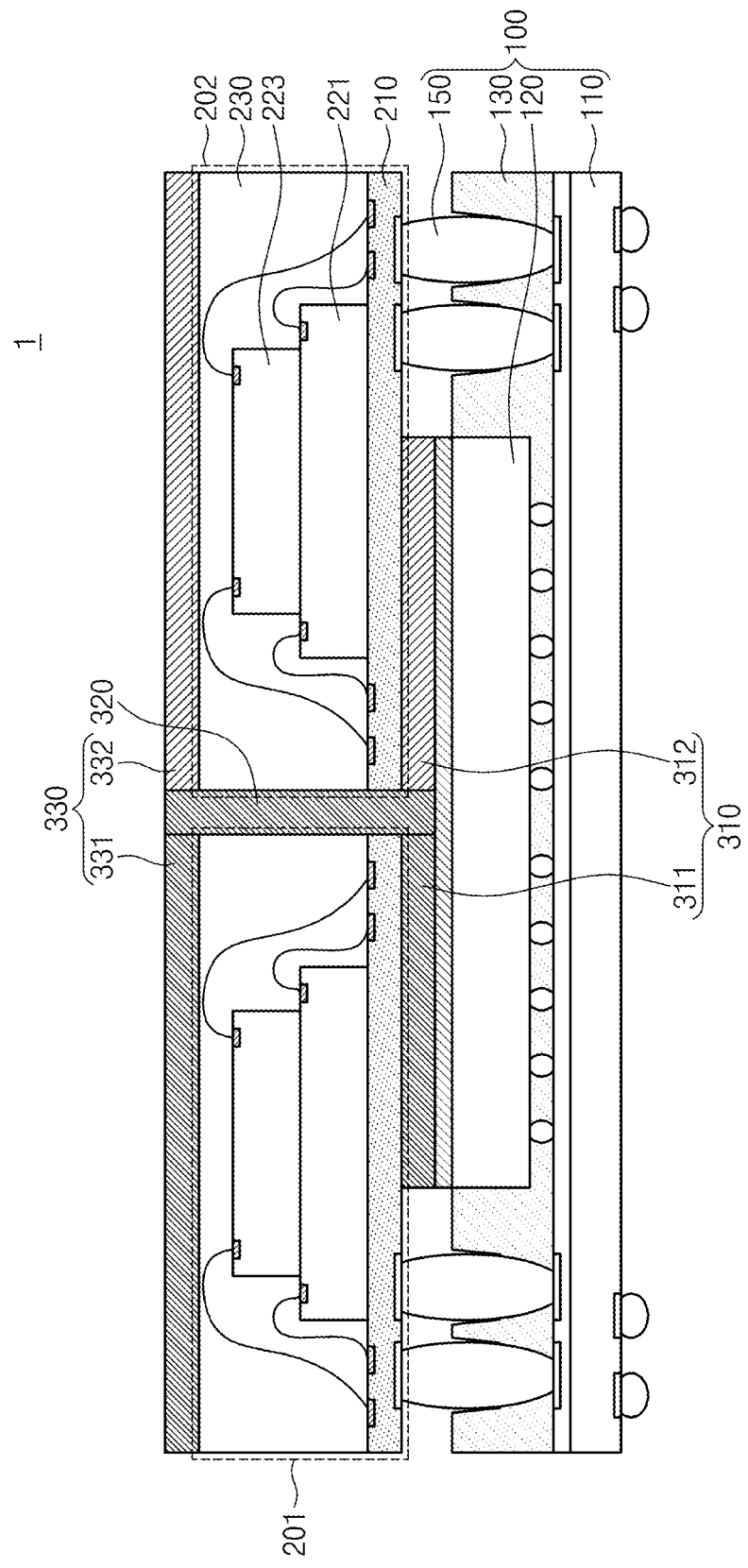

FIGS. 4 to 6 are perspective views and a cross-sectional view illustrating a method of manufacturing a semiconductor package according to example embodiments of inventive concepts. Hereinafter, the same descriptions as in the aforementioned semiconductor packages according to example embodiments of inventive concepts will be omitted or mentioned briefly for the purpose of ease and convenience in explanation.

Referring to FIGS. 1 and 4, a first upper package 201 surrounded by a first group 301 may be prepared. The first upper package 201 may be used as one of the upper packages 200 illustrated in FIG. 1. In other words, the first upper package 201 may include an upper substrate 210, a first upper semiconductor chip 221, a second upper semiconductor chip 223 and an upper mold layer 230, the upper package 200 illustrated in FIG. 1. In example embodiments, the first group 301 may have a '⊂'-shape surrounding the first upper package 201. The first group 301 may include a first lower heat exhaust part 311, a first intermediate heat exhaust part 321, and a first upper heat exhaust part 331. The first upper heat exhaust part 331 may cover a top surface 201a of the first upper package 201. The first lower heat exhaust part 311 may be provided on a portion of a bottom surface 201b of the first upper package 201. For example, the first lower heat exhaust part 311 may cover a portion of the bottom surface 201b of the first upper package 201, that corresponds to the center region A1 of the lower substrate 110 illustrated in FIG. 1. The first intermediate heat exhaust part 321 may be formed on a sidewall 201c of the first upper package 201. The first intermediate heat exhaust part 321 may cover a portion (e.g., a half) of the sidewall 201c of the first upper package 201. Both ends of the first intermediate heat exhaust part 321 may be connected to the first upper heat exhaust part 331 and the first lower heat exhaust part 311, respectively. An adhesive layer (not shown) may be provided between the first group 301 and the first upper package 201. The first group 301 may be adhered to the first upper package 201 by the adhesive layer (not shown).

Referring to FIG. 5, a second upper package 202 surrounded by a second group 302 may be prepared. The second group 302 may include a second lower heat exhaust part 312, a second intermediate heat exhaust part 322, and a second upper heat exhaust part 332. A size and a shape the second group 302 may be the same as or similar to those of the first group 301. For example, the first group 301 and the second group 302 may be point-symmetrical with respect to a center point of the lower package 100 of FIG. 1 when viewed from a plan view. The second group 302 and the first group 301 may be rotationally symmetrical. The second upper package 202 may have the same shape and the same size as the first upper package 201. The first upper package 201 and the first group 301 may be formed and then may be symmetrically moved to realize the second upper package 202 and the second group 302. Thus, an additional manufacture process for the second upper package 202 and the second group 302 may not be required. The first upper package 201 surrounded by the first group 301 may be combined with the second upper package 202 surrounded by the second group 302, thereby forming upper packages 200 including heat exhaust parts 310, 320 and 330. The first and second lower heat exhaust parts 311 and 312 may constitute a lower heat exhaust part 310, the first and second intermediate heat exhaust parts 321 and 322 may constitute an intermediate heat exhaust part 320, and the first and second upper heat exhaust parts 331 and 332 may constitute an upper heat exhaust part 330. The first and second intermediate heat exhaust parts 321 and 322 may be in contact with each other and an interface may exist between the first and second intermediate heat exhaust parts 321 and 322. As illustrated in FIG. 5, the first and second intermediate heat exhaust parts 321 and 322 may be arranged in a longitudinal direction of a space between the first and second upper packages 201 and 202. The first intermediate heat exhaust part 321 may be in contact with the first and second upper packages 201 and 202. The second intermediate heat exhaust part 322 may also be in contact with the first and second upper packages 201 and 202. The intermediate heat exhaust part 320 of FIG. 1 may be the intermediate heat exhaust part 320 including the first and second intermediate heat exhaust parts 321 and 322 of FIG. 5.

Referring to FIG. 6, the first and second upper packages 201 and 202 combined with each other may be mounted on a lower package 100. The first and second upper packages 201 and 202 may be electrically connected to the lower package 100. The first and second lower heat exhaust parts 311 and 312 of FIG. 5 may be combined with each other to form a lower heat exhaust part 310. The first and second intermediate heat exhaust parts 321 and 322 of FIG. 5 may be combined with each other to form an intermediate heat exhaust part 320. The first and second upper heat exhaust parts 331 and 332 of FIG. 5 may be combined with each other to form an upper heat exhaust part 330. The lower package 100 may be the same as or similar to the lower package 100 described with reference to FIG. 1. The semiconductor package 1 illustrated in FIG. 1 may be manufactured by the manufacture processes described above.

Figure 9:
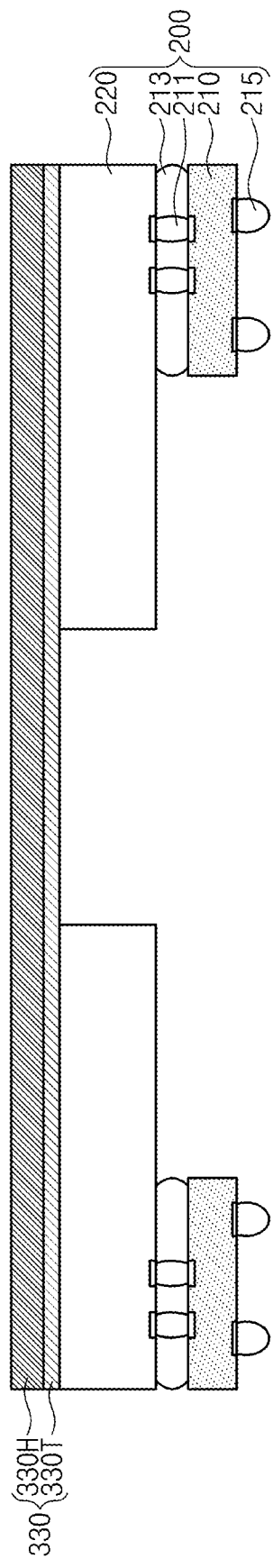
FIGS. 9 to 11 are cross-sectional views illustrating a method of manufacturing a semiconductor package according to example embodiments of inventive concepts.
Figure 10:
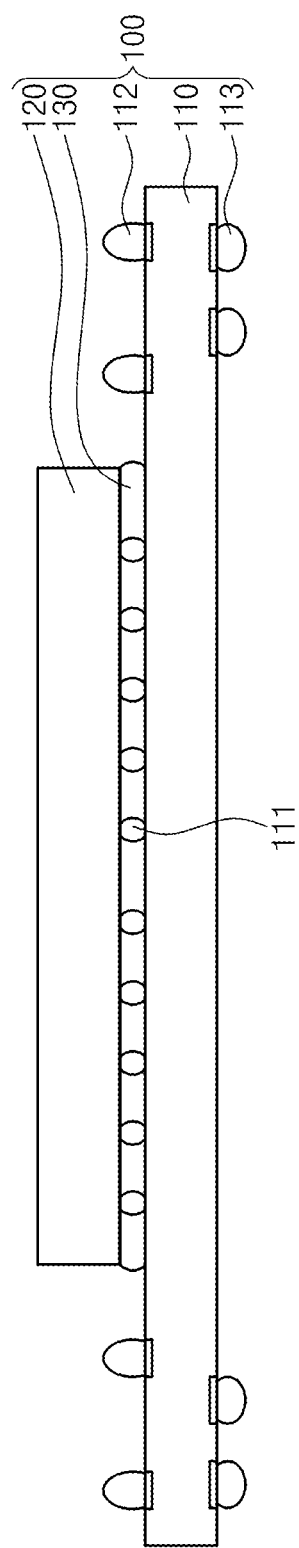
Figure 11:
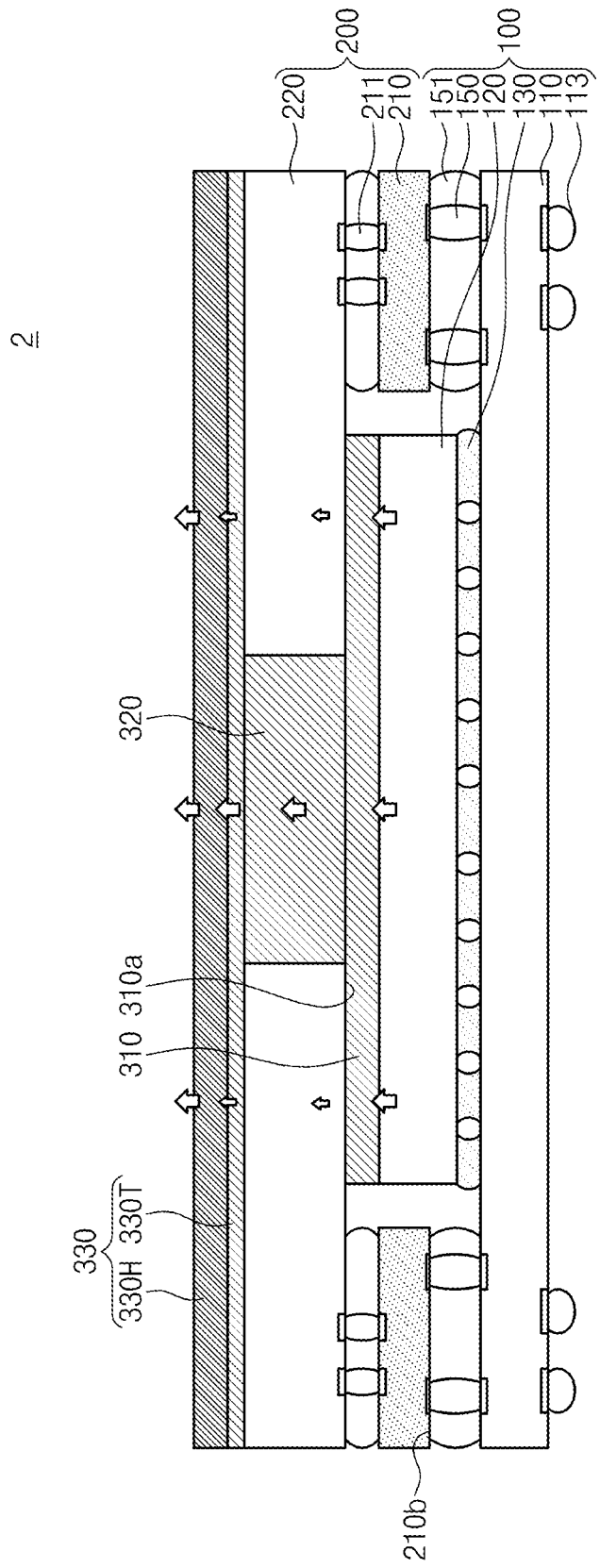

FIGS. 9 to 11 are cross-sectional views illustrating a method of manufacturing a semiconductor package according to example embodiments of inventive concepts. Hereinafter, the same descriptions as in the aforementioned semiconductor packages according to example embodiments of inventive concepts and/or methods of manufacturing thereof will be omitted or mentioned briefly for the purpose of ease and convenience in explanation.

Referring to FIG. 9, upper packages 200 on which an upper heat exhaust part 330 is formed may be prepared. Preparing the upper packages 220 may include preparing upper substrates 210 constituting one united body, forming upper semiconductor chips 220 spaced apart from each other on the one united upper substrates 210, and forming an upper heat exhaust part 330 covering the upper semiconductor chips 220. However, example embodiments of inventive concepts are not limited thereto. Upper solder balls 211 and an upper adhesive pattern 213 may be formed between the upper substrate 210 and the upper semiconductor chip 220. The upper heat exhaust part 330 may include an upper heat transferring layer 330T and an upper heat slug 330H. The upper substrate 210 may further include first solder balls 215 formed on a bottom surface of the upper substrate 210.

Referring to FIG. 10, a lower package 100 may be provided. The lower package 100 may include the lower substrate 110, the lower semiconductor chip 120 and the lower mold layer 130 that are described with reference to FIG. 2. Second solder balls 112 may be formed on an edge region of the top surface of the lower substrate 110. The second solder balls 112 may surround the lower semiconductor chip 120 when viewed from a plan view.

Referring to FIG. 11, the upper packages 200 may be mounted on the lower package 100. For example, the upper packages 200 may be disposed on the lower substrate 110. The first solder balls 215 of the upper packages 200 may contact the second solder balls 112 of the lower substrate 110 to form interconnecting parts 150. The upper packages 200 may be electrically connected to the lower package 100 through the interconnecting parts 150. An adhesive pattern 151 may be formed to surround the interconnecting parts 150. A thermal interface material (TIM) may be applied on the lower semiconductor chip 120 to form a lower heat exhaust part 310. A thermal interface material (TIM) may fill a space between the upper packages 200 and between the lower heat exhaust part 310 and the upper heat exhaust part 330, thereby forming an intermediate heat exhaust part 320. In the mounting process of the upper packages 200, the upper packages 200 may be mounted on the lower substrate 110 such that a bottom surface 210b of the upper substrate 210 may be disposed at a lower level than a top surface 310a of the lower heat exhaust part 310. Thus, the lower semiconductor chip 120 may be disposed between the upper substrates 210. As a result, the semiconductor package 2 illustrated in FIG. 3A may be manufactured.

Figure 12:
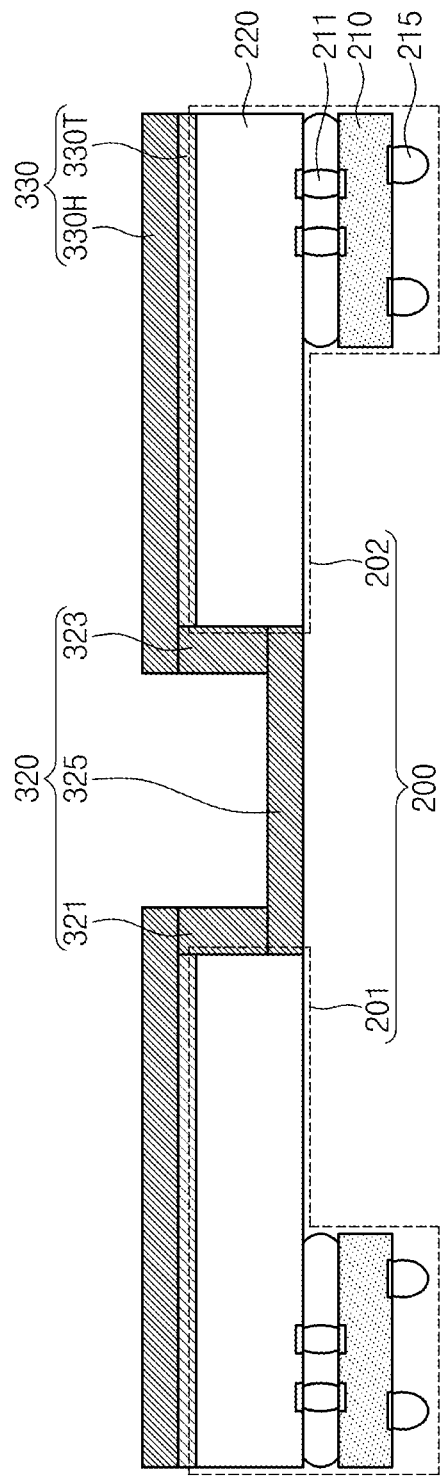
FIGS. 12 and 13 are cross-sectional views illustrating a method of manufacturing a semiconductor package according to example embodiments of inventive concepts.
Figure 13:
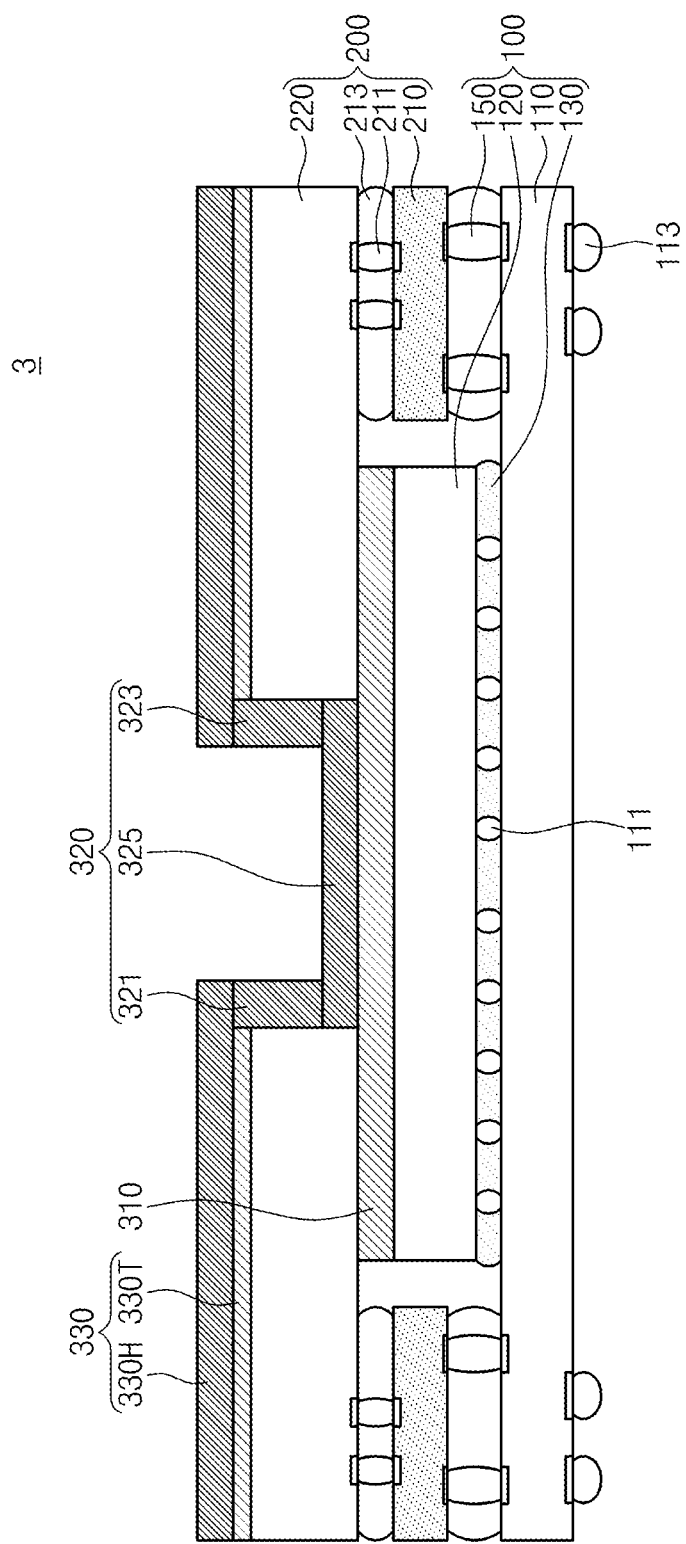

FIGS. 12 and 13 are cross-sectional views illustrating a method of manufacturing a semiconductor package according to example embodiments of inventive concepts. Hereinafter, the same descriptions as in the aforementioned semiconductor packages according to example embodiments of inventive concepts and/or methods of manufacturing thereof will be omitted or mentioned briefly for the purpose of ease and convenience in explanation.

Referring to FIG. 12, an upper heat exhaust part 330 and an intermediate heat exhaust part 320 may be formed on upper packages 200. For example, the upper heat exhaust part 330 may be formed on top surfaces of the upper packages 200. The intermediate heat exhaust part 320 may be formed between the upper packages 200. For example, a first heat slug 321 may be formed on a sidewall of a first upper package 201. A second heat slug 323 may be formed on a sidewall of a second upper package 202. At this time, the second heat slug 323 may face and be spaced apart from the first heat slug 321. A third heat slug 325 may be formed such that both ends of the third heat slug 325 may be connected to a bottom end of the first heat slug 321 and a bottom end of the second heat slug 323, respectively.

Referring to FIG. 13, the upper packages 200 may be mounted on a lower package 100. The lower package 100 may include a lower substrate 110 and a lower semiconductor chip 120 mounted on the lower substrate 110. The mounting process of the upper package 200 may be the same as or similar to the mounting process described with reference to FIG. 11. However, an additional process for the formation of the intermediate heat exhaust part 320 may not be required. As a result, the semiconductor package 3 illustrated in FIG. 4 may be manufactured.

Figure 14:
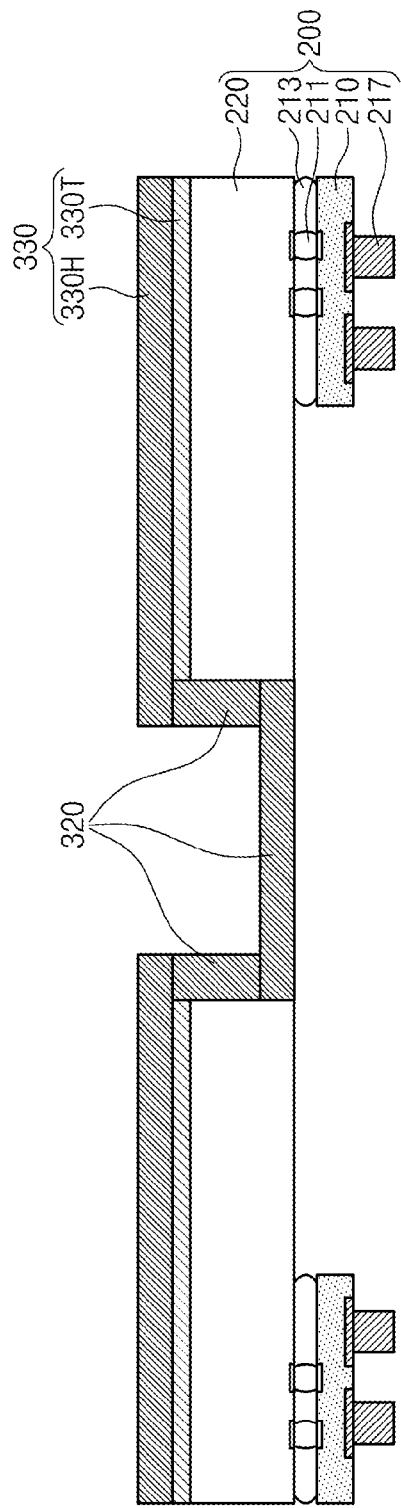
FIGS. 14 to 16 are cross-sectional views illustrating a method of manufacturing a semiconductor package according to example embodiments of inventive concepts.
Figure 15:
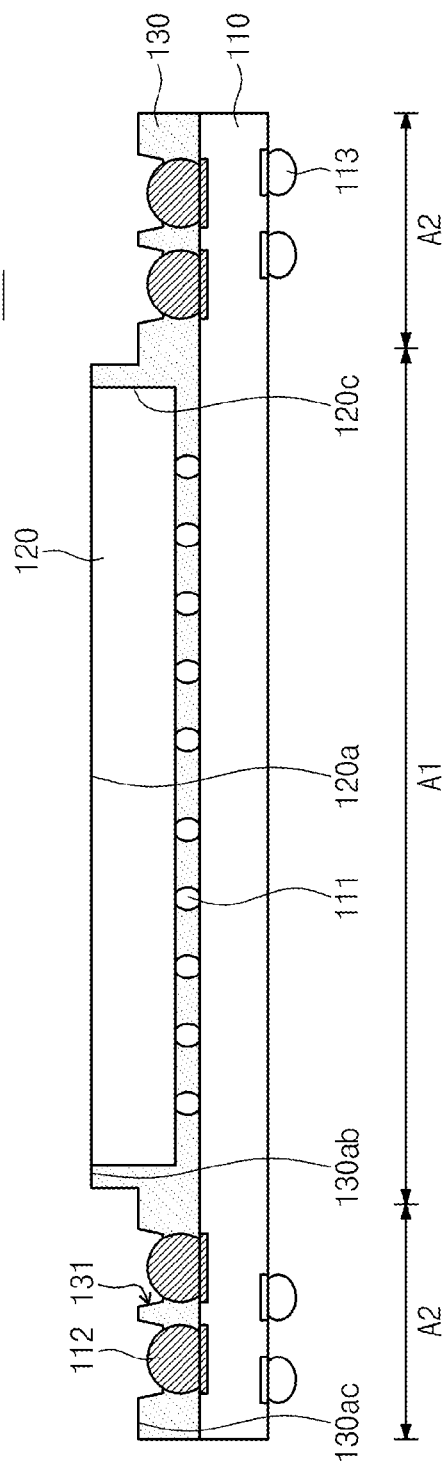
Figure 16:
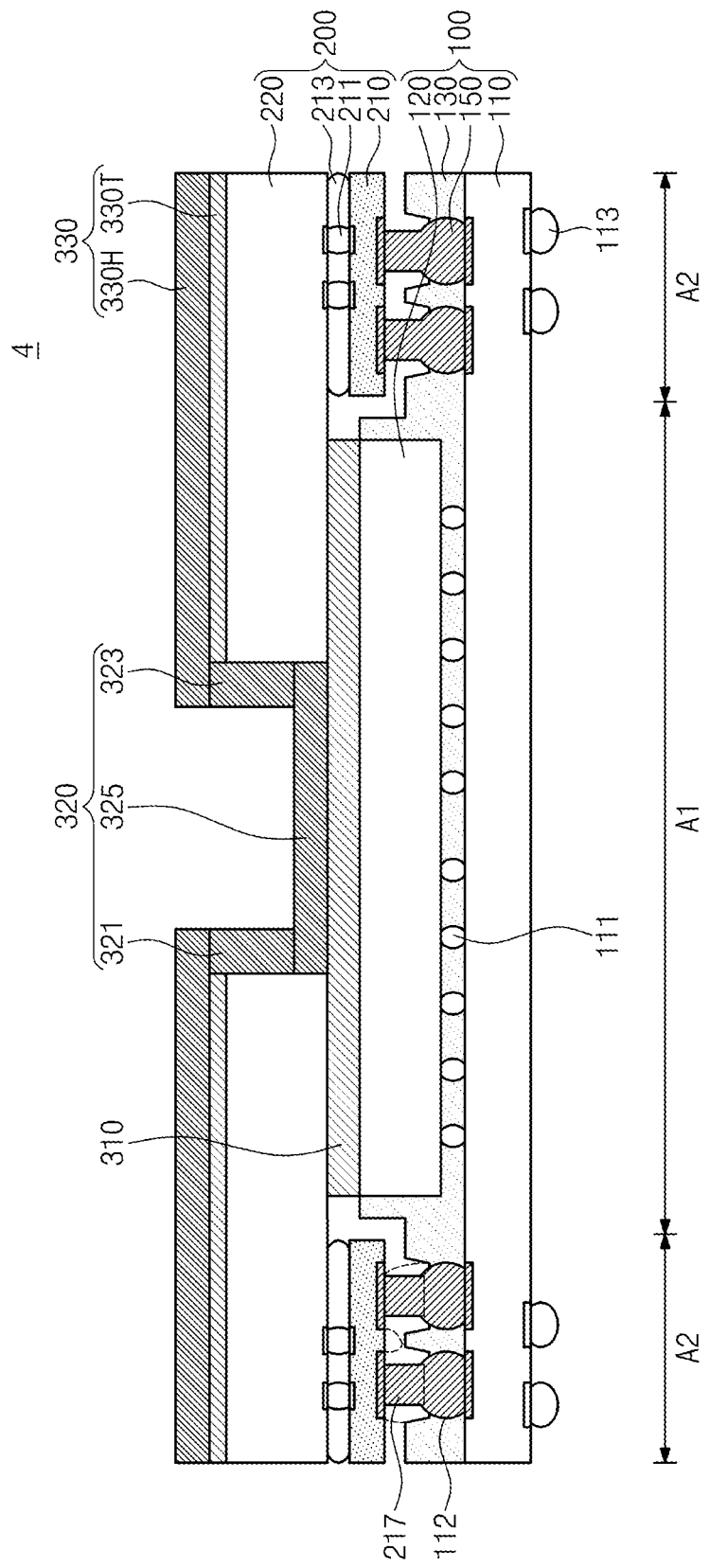

FIGS. 14 to 16 are cross-sectional views illustrating a method of manufacturing a semiconductor package according to example embodiments of inventive concepts. Hereinafter, the same descriptions as in the aforementioned semiconductor packages according to example embodiments of inventive concepts and/or methods of manufacturing thereof will be omitted or mentioned briefly for the purpose of ease and convenience in explanation.

Referring to FIG. 14, an upper heat exhaust part 330 and an intermediate heat exhaust part 320 may be formed on upper packages 200. Pillars 217 may be formed on a bottom surface of the upper substrate 210 unlike FIG. 12. The pillars 217 may include a conductive material (e.g., copper).

Referring to FIG. 15, a lower package 100 may be manufactured. In example embodiments, a lower semiconductor chip 120 may be mounted on a center region A1 of a lower substrate 110. A lower mold layer 130 may be formed on one surface of the lower substrate 110 to surround a sidewall 120c of the lower semiconductor chip 120. In example embodiments, a top surface of the lower mold layer 130 may be formed to be disposed at a substantially same level as a top surface 120a of the lower semiconductor chip 120. Thereafter, portions of the lower mold layer 130 on an edge region A2 of the lower substrate 110 may be removed by a laser drilling process. In example embodiments, the portions of the lower mold layer 130 may be removed to form openings 131 exposing the lower substrate 110. Solder balls 112 may be formed in the openings 131, respectively. The solder balls 112 may be electrically connected to the lower substrate 110. Alternatively, the lower mold layer 130 on the edge region A2 may be partially removed to have a top surface 130ac lower than the top surface 120a of the lower semiconductor chip 120. External terminals 113 may be formed on a bottom surface of the lower substrate 110. A formation order of the external terminals 113 is not limited to a specific order.

Referring to FIG. 16, a thermal interface material may be applied on the lower semiconductor chip 120 to form a lower heat exhaust part 310. Upper packages 200 may be mounted on the lower package 100 to be electrically connected to the lower package 100. In example embodiments, the pillars 217 of the upper packages 200 may contact the solder balls 112 of the lower package 100 to form interconnecting parts 150. When the upper packages 200 are mounted on the lower package 100, a mechanical and/or thermal stress may be applied to the interconnecting parts 150. If solder balls (not shown) are provided on the bottom surface of the upper substrate 210, the solder balls (not shown) of the upper substrate 210 may be deformed by a wetting phenomenon caused by the stress like a dotted line of FIG. 16. Additionally, an electrical short may occur between interconnecting parts 150 using the solder balls (not shown) of the upper substrate 210. However, according to example embodiments of inventive concepts, the pillars 217 may be provided on the top surface of the upper substrate 210, so that the interconnecting parts 150 may be satisfactorily formed. The upper substrate 210 may be disposed on the lower mold layer 130 on the edge region A2 of the lower substrate 110. A height of the lower mold layer 130 on the edge region A2 may be controlled by the laser drilling process, as described above. The height of the lower mold layer 130 on the edge region A2 may be controlled to correspond to a shape and a size of the upper substrate 210. Thus, the lower heat exhaust part 310 may be disposed between the upper substrates 210. As a result, the semiconductor package 4 illustrated in FIG. 3C may be manufactured.

APPLICATIONS

Figure 7:
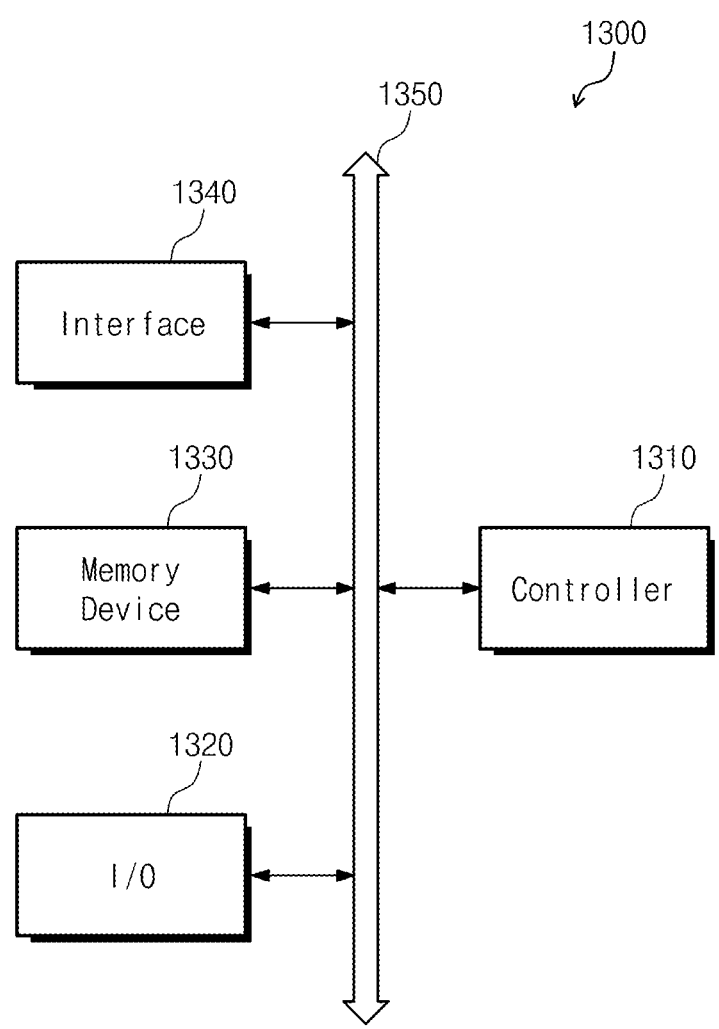
FIG. 7 is a schematic block diagram illustrating an example of electronic systems including semiconductor packages according to example embodiments of inventive concepts.
Figure 8:
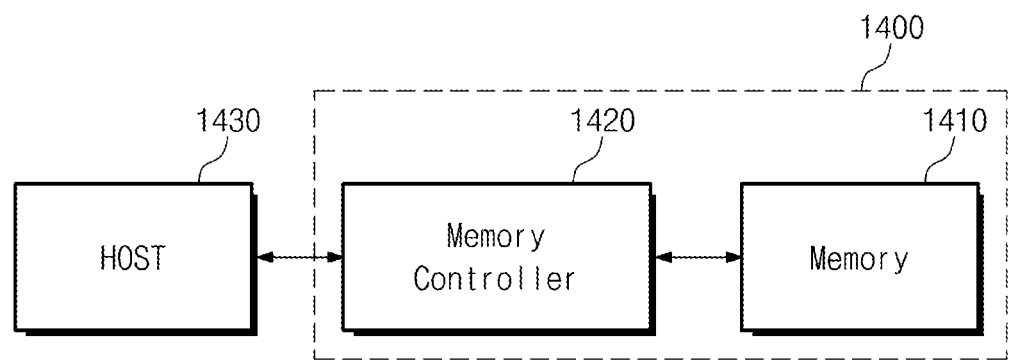
FIG. 8 is a schematic block diagram illustrating an example of memory cards including semiconductor packages according to example embodiments of inventive concepts.

FIG. 7 is a schematic block diagram illustrating an example of electronic systems including semiconductor packages according to example embodiments of inventive concepts. FIG. 8 is a schematic block diagram illustrating an example of memory cards including semiconductor packages according to example embodiments of inventive concepts.

Referring to FIG. 7, an electronic system 1300 may include a controller 1310, an input/output (I/O) unit 1320, and a memory device 1330. The controller 1310, the I/O unit 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, or other logic devices having a similar function to any one thereof. The controller 1310 and the memory device 1330 may include at least one of the semiconductor packages 1 to 4 according to the aforementioned example embodiments of inventive concepts. The I/O unit 1320 may include a keypad, a keyboard and/or a display unit. The memory device 1330 stores data. The memory device 1330 may store data and/or commands executed through the controller 1310. The memory device 1330 may include a volatile memory device and/or a non-volatile memory device. In example embodiments, the memory device 1330 may include a flash memory device. For example, the flash memory device applied with a semiconductor package technique according to example embodiments of inventive concepts may be installed in an information processing system such as a mobile device or a desk top computer. The flash memory device may be realized as solid state disks (SSD). In this case, the electronic system 1300 may stably store massive data in the memory device 1330. The electronic system 1300 may further include an interface unit 1340 that transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, the electronic system 1300 may further include an application chipset and/or a camera image processor (CIS).

The electronic system 1300 may be realized as a mobile system, a personal computer, an industrial computer, or a multi-functional logic system. For example, the mobile system may be one of a personal digital assistant (PDA), a portable computer, a web tablet, a wireless phone, a mobile phone, a laptop computer, a digital music player, a memory card, or an information transmitting/receiving system. If the electronic system 1300 is an apparatus capable of performing a wireless communication, the electronic device 1300 may be used in a communication interface protocol such as a third generation communication system (e.g., CDMA, GSM, NADC, E-TDMA, WCDMA, CDMA2000).

Referring to FIG. 8, a memory card 1400 may include a non-volatile memory device 1410 and a memory controller 1420. The non-volatile memory device 1410 and the memory controller 1420 may store data or may read stored data. The non-volatile memory device 1420 may include at least one of the semiconductor packages 1 to 4 according to the aforementioned example embodiments of inventive concepts. The memory controller 1420 may read data from/store data into the non-volatile memory device 1410 in response to read/write request of a host 1430.

According to example embodiments of inventive concepts, the semiconductor package includes the lower heat exhaust part on the lower package, the intermediate heat exhaust part between the upper packages, and the upper heat exhaust part covering the upper packages. The both ends (e.g., a top end and a bottom end) of the intermediate heat exhaust part may be connected to the lower heat exhaust part and the upper heat exhaust part, respectively. Thus, the heat generated from the lower semiconductor chip may be exhausted to the outside of the semiconductor package through the lower, intermediate and upper heat exhaust parts. As a result, operation reliability of the semiconductor package may be improved.

While some example embodiments of inventive concepts have been particularly shown described with reference, it will be apparent to those skilled in the art that various changes and modifications may be made without departing from the spirits and scopes of the claims. Therefore, it should be understood that example embodiments of inventive concepts described herein should be considered in a descriptive sense, not for purposes of limitation. Descriptions of features or aspects within each semiconductor package according to example embodiments of inventive concepts should be typically considered as available for other similar features or aspects in other semiconductor packages according to example embodiments.

What is claimed is:
1. A semiconductor package comprising:
a lower package;

upper packages on the lower package, the upper packages laterally spaced apart from each other;

a lower heat exhaust part between the lower package and the upper packages;

an intermediate heat exhaust part between the upper packages, the intermediate heat exhaust part connected to the lower heat exhaust part, the intermediate heat exhaust part including a first intermediate heat exhaust part and a second intermediate heat exhaust part, the first and the second intermediate heat exhaust parts being arranged in a longitudinal direction of a space between two of the upper packages; and an upper heat exhaust part on the upper packages, the upper heat exhaust part connected to the intermediate heat exhaust part.

2. The semiconductor package of claim 1, wherein at least one of the lower, intermediate, and upper heat exhaust parts include a heat slug.

3. The semiconductor package of claim 1, wherein each of the upper packages comprises:
an upper substrate;
a first upper semiconductor chip on the upper substrate;
a second upper semiconductor chip on the first upper semiconductor chip; and
an upper mold layer covering the second and first upper semiconductor chips.

4. The semiconductor package of claim 1, wherein
the two of the upper packages are a first upper package and a second upper package, and
the first and second upper packages have a same shape and a same size.

5. The semiconductor package of claim 4, wherein
the first intermediate heat exhaust part is in contact with the first and second upper packages,
the second intermediate heat exhaust part is in contact with the first and second upper packages, and
a size and shape of the first intermediate heat exhaust part is the same as a size and shape of the second intermediate heat exhaust part.

6. The semiconductor package of claim 1, wherein
the lower package includes a lower substrate and a lower semiconductor chip,
each of the upper packages includes an upper substrate and an upper semiconductor chip,
the upper substrates of the upper packages are connected to each other,
the upper substrates of the upper packages are on an edge region of a top surface of the lower substrate, and
the lower semiconductor chip is on a center region of the top surface of the lower substrate.

7. The semiconductor package of claim 6, wherein
bottom surfaces of the upper substrates are at a lower level than a bottom surface of the lower heat exhaust part, and
the lower heat exhaust part is surrounded by the upper substrates when viewed from a plan view.

8. The semiconductor package of claim 6, wherein the lower heat exhaust part includes a thermal interface material (TIM).

9. The semiconductor package of claim 6, wherein
the first intermediate heat exhaust part is a first heat slug on a sidewall of one of the two of the upper packages,
the second intermediate heat exhaust part is a second heat slug on a sidewall of an other of the two of the upper packages.

10. The semiconductor package of claim 6, wherein
the lower package further includes a lower mold layer on a top surface of the lower substrate, and a top surface of the lower mold layer on the edge region is at a lower level than a top surface of the lower semiconductor chip.

11. The semiconductor package of claim 1, wherein the lower heat exhaust part is in contact with bottom surfaces of the upper packages.

12. A semiconductor package comprising:
a lower package including a lower substrate, a lower semiconductor chip on the lower substrate, and a lower mold layer surrounding a sidewall of the lower semiconductor chip;
upper packages on the lower package;
a lower heat exhaust part between the lower semiconductor chip and the upper packages, the lower heat exhaust part contacting a top surface of the lower semiconductor chip;
an intermediate heat exhaust part between the upper packages, the intermediate heat exhaust part connected to the lower heat exhaust part; and
an upper heat exhaust part on the upper packages, the upper heat exhaust part connected to the intermediate heat exhaust part,
wherein the upper packages include a first upper package and a second upper package that are laterally spaced apart from each other in a first direction,
wherein the first upper package includes a first sidewall and the second upper package includes a second sidewall, the first sidewall, and the second sidewall facing each other, and
wherein the intermediate heat exhaust part includes a first intermediate heat exhaust part and a second intermediate heat exhaust part,
wherein the first and second intermediate heat exhaust parts are arranged in a longitudinal direction of a space between the first and second upper packages, and
wherein each of the first and second intermediate heat exhaust parts directly contacts with the first sidewall and the second sidewall.

13. The semiconductor package of claim 12, wherein at least one of the lower, intermediate, and upper heat exhaust parts include a heat slug.

14. A semiconductor package comprising:
a lower substrate;
a lower semiconductor chip on the lower substrate;
a heat exhaust structure on the lower semiconductor chip, the heat exhaust structure including a lower heat exhaust part connected to an upper heat exhaust part through an intermediate heat exhaust part; and
upper packages on the heat exhaust structure between the lower heat exhaust part and the upper heat exhaust part, the upper packages separated from each other by the intermediate heat exhaust part,
wherein the upper packages include a first upper package and a second upper package that are laterally spaced apart from each other in a first direction,
wherein the intermediate heat exhaust part is on top of the lower semiconductor chip and includes a first intermediate heat exhaust part and a second intermediate heat exhaust part, and
wherein the first and second intermediate heat exhaust parts are arranged in a longitudinal direction of a space between the first and second upper packages.

15. The semiconductor package of claim 14, wherein
at least one of the lower, intermediate, and upper heat exhaust parts include a heat slug having a thermal conductivity that is greater than a thermal conductivity of air.

16. The semiconductor package of claim 14, wherein at least one of the lower, intermediate and upper heat exhaust parts include a thermal interface material (TIM).

17. The semiconductor package of claim 14, wherein
the upper packages each include an upper semiconductor chip, and
the lower semiconductor chip is electrically connected to the upper semiconductor chips of the upper packages, respectively.

18. The semiconductor package of claim 17, wherein
the upper packages each include an upper substrate,
a portion of each one of the upper semiconductor chips is on a corresponding one of the upper substrates, and
bottom surfaces of the upper substrates are at a lower level than a bottom surface of the lower heat exhaust part.

19. The semiconductor package of claim 14, wherein
the upper packages each include a plurality of upper semiconductor chips sequentially stacked on each other, and
the lower semiconductor chip is electrically connected to the upper semiconductor chips of the upper packages, respectively.

* * * * *